(12) United States Patent
Xu et al.

(10) Patent No.: US 8,338,084 B2
(45) Date of Patent: Dec. 25, 2012

(54) PATTERNING METHOD

(75) Inventors: Qiuxia Xu, Beijing (CN); Huajie Zhou, Beijing (CN)

(73) Assignee: Institute of Microelectronics, Chinese Academy of Sciences, Beijing (CH)

( * ) Notice: Subject to any disclaimer, the term of this patent is extended or adjusted under 35 U.S.C. 154(b) by 252 days.

(21) Appl. No.: 12/922,944

(22) PCT Filed: Jun. 28, 2010

(86) PCT No.: PCT/CN2010/074592
§ 371 (c)(1),
(2), (4) Date: Sep. 16, 2010

(87) PCT Pub. No.: WO2011/050623
PCT Pub. Date: May 5, 2011

(65) Prior Publication Data
US 2011/0200947 A1    Aug. 18, 2011

(30) Foreign Application Priority Data

Oct. 28, 2009   (CN) .......................... 2009 1 0236719

(51) Int. Cl.
*G03F 7/26* (2006.01)
(52) U.S. Cl. ........................................ 430/313
(58) Field of Classification Search ............ 430/313
See application file for complete search history.

(56) References Cited

U.S. PATENT DOCUMENTS

| | | | | |
|---|---|---|---|---|
| 6,090,672 A | * | 7/2000 | Wanlass | 438/301 |
| 2004/0023462 A1 | * | 2/2004 | Rotondaro et al. | 438/287 |
| 2007/0072350 A1 | * | 3/2007 | Ohnuma | 438/149 |
| 2007/0254393 A1 | * | 11/2007 | Johnson | 438/38 |
| 2007/0298585 A1 | * | 12/2007 | Lubomirsky et al. | 438/435 |
| 2008/0138972 A1 | * | 6/2008 | Kang et al. | 438/595 |

FOREIGN PATENT DOCUMENTS

| | | |
|---|---|---|
| CN | 1746773 | 3/2006 |
| CN | 101656208 | 2/2010 |
| TW | 425632 | 3/2001 |

OTHER PUBLICATIONS

Seraphim, ed. "Principles of Electronic Packing", McGraw-Hill, 1989, pp. 377-379.*

* cited by examiner

*Primary Examiner* — Kathleen Duda
(74) *Attorney, Agent, or Firm* — Westman, Champlin & Kelly, P.A.

(57) ABSTRACT

A method of patterning a dielectric layer with a Zep 520 positive EB photoresist as a mask, comprising the steps of depositing an α-Si film on the dielectric layer; providing a layer of Zep 520 positive EB photoresist having high-resolution patterns therein by electron beam direct writing; etching the α-Si film by chlorine-based plasma with the layer of Zep 520 positive EB photoresist as a mask, so as to transfer the high-resolution patterns of the Zep 520 positive EB photoresist to the underlying α-Si film; removing the Zep 520 positive EB photoresist; etching the dielectric layer by fluorine-based plasma with the α-Si film having high-fidelity patterns as a hard mask, so as to provide patterns of recesses; and removing the α-Si film by wet etching or dry etching. The inventive method is completely compatible with and easily incorporated into the conventional CMOS processes, with high reliability and resolution for providing nanoscale fine patterns of recesses. It solves the above-mentioned problem in the fabrication of novel structure of CMOS device.

9 Claims, 1 Drawing Sheet

PATTERNING METHOD

CROSS-REFERENCE TO RELATED APPLICATION

This Application is a Section 371 National Stage Application of International Application No. PCT/CN2010/074592, filed Jun. 28, 2010, not yet published in the international stage, the contents of which are hereby incorporated by reference in their entirety.

FIELD OF INVENTION

The present invention relates to a method of patterning a dielectric layer used in manufacture of a nanoscale semiconductor device, and in particular, to a method of patterning a dielectric layer in which a positive electron beam (EB) photoresist is used.

DESCRIPTION OF PRIOR ART

With the development of CMOS integration technology from sub-50 nanometer towards a further scaled dimension, novel device structures, such as FinFETs, multi-gate/surrounding gate CMOS FETs, nanowires, and the like, are continuously proposed so as to solve the problems with respect to inherent short channel effects, which become more and more serious in planar CMOS devices formed in a bulk silicon, and large current leakage. In manufacturing these novel device structures, it is necessary to form nanoscale recesses having a large aspect ratio in a dielectric layer by etching. To form such narrow recesses, a EB photoresist having a high resolution is required. A Zep 520 positive EB photoresist (commercially available from Nippon Zeon Co. Ltd) is preferable for this purpose, with which a photoresist mask having high-resolution nanoscale patterns can be formed by lithography of electron beam direct writing. However, such a photoresist has a poor property of anti-etching during the conventional etching of dielectric, because it may easily react with fluorine-based (F) plasma, resulting in a plastic flow and thus destroying the patterns of recesses in the photoresist.

SUMMARY OF THE INVENTION

An object of the present invention is to provide a method of patterning a dielectric layer using photoresist so as to solve the problem that the positive EB photoresist, such as Zep 520, can not be subjected to reactive ion etching using fluorine-based plasma.

For this purpose, the present invention provides a method of patterning a dielectric layer, comprises the steps of:
1) depositing a layer of α-Si film on a dielectric layer to be processed;
2) forming a photoresist mask with patterns on the α-Si film;
3) etching the α-Si film by chlorine-based plasma with the photoresist mask, so as to transfer the patterns of the photoresist mask to the α-Si film;
4) removing the photoresist mask;
5) etching the dielectric layer by the fluorine-based plasma with the α-Si film as a hard mask, so as to transfer the patterns of the α-Si film to the dielectric layer;
6) removing the α-Si film.

In order for the fine patterns prepared by electron beam direct writing on the Zep 520 to remain on the dielectric layer, a Zep 520 layer is formed on the α-Si film. And then the α-Si film may be etched by the chlorine-based plasma and the patterns of the Zep 520 photoresist are transferred to the α-Si film. Next, the dielectric layer is masked by the patterns of the α-Si film after the Zep 520 photoresist is removed. Then the dielectric layer is etched by fluorine-based plasma and the nanoscale patterns of the recesses are provided. Finally, the α-Si film may be removed by dry or wet etching.

The present invention has the following advantages. Because the α-Si film may be easily etched by chlorine-based plasma with a high accuracy of etching, and the photoresist mask such as Zep 520 dose not resist the etching of fluorine-based plasma while may resist the etching of chlorine-based plasma, the α-Si film is used as an intermediate layer, so that the patterns of the photoresist mask may be transferred to the α-Si film by etching using chlorine-based plasma.

In the following step, since the etching using fluorine-based plasma has a high selectivity for the α-Si film with respect to the dielectric layer, the α-Si film is used as a hard mask, so that the high-resolution patterns of the α-Si film are transferred to the dielectric layer by etching using fluorine-based plasma, resulting in fine patterns formed in the dielectric layer.

Furthermore, the removing of the α-Si film will not damage the patterns in the dielectric layer regardless of wet or dry etching, which is because the etching rate for the dielectric layer is very low.

The inventive method is completely compatible with and easily incorporated into the conventional CMOS processes, and has high reliability and resolution for providing nanoscale fine patterns of recesses. It solves the above-mentioned problem in the fabrication of the novel structure of CMOS device.

DETAILED DESCRIPTION OF PREFERRED EMBODIMENTS

The invention provides a method to solve the problem that the Zep 520 positive EB photoresist can not serve as a mask when etching a dielectric layer. An example of the method includes the following steps:

depositing an α-Si film having a thickness of 120-150 nm on a dielectric layer to be etched, at the temperature of 520-550° C.;

performing cleaning, spin drying and then baking in an oven at 800° C. in $N_2$ as a protective gas for about 30 minutes;

spin-coating a layer of Zep 520 positive EB photoresist with a thickness of 400-600 nm;

performing baking in an oven at a temperature of 170-180° C. for about 20-40 minutes, with a slow heating/cooling rate;

exposing the Zep 520 positive EB photoresist by electron beam direct wiring, and then developing it so as to provide nanoscale patterns of recesses with high resolution in the Zep 520 positive EB photoresist;

performing baking at a temperature of 130-140° C. for about 30-50 minutes;

etching the α-Si film by chlorine-based plasma with the Zep 520 positive EB photoresist as a mask, so that the patterns in the Zep 520 positive EB photoresist are transferred to the α-Si film with high fidelity; for example, a mixed gas source of $Cl_2$ and He, or $Cl_2$ and Ar, or $Cl_2$ and $O_2$ can be used for generating the chlorine-based plasma;

removing the Zep 520 positive EB photoresist; for example, the photoresist mask can be removed by dry etching using $O_2$ plasma, or by wet etching using an etching solution of $H_2SO_4:H_2O_2=3:1-5:3$;

etching the dielectric layer by fluorine-based plasma with the α-Si film as a mask, so that the patterns in the α-Si film are transferred to the dielectric layer with a high fidelity; for example, $CF_4$, $CHF_3$, $C_3F_8$, $C_4F_8$, $NF_3$, or a mixture thereof, such as a mixed gas source of $CF_4$ and $CHF_3$, can be used for generating the fluorine-based plasma;

removing the α-Si film and finishing the formation of the nanoscale fine patterns of recesses in the dielectric layer. For example, the α-Si film can be removed by dry etching using chlorine-based plasma, or by wet etching using an aqueous solution of $NH_4OH$.

Figure 1:
FIG. 1 is a SEM image showing the cross section after etching the dielectric layers with a Zep 520 positive EB photoresist by fluorine-based plasma, in which the Zep 520 photoresist is damaged by a plastic flow and the dielectric layer can not be etched in the following step.
Figure 2:
FIG. 2 is a SEM image showing the cross section after the dielectric layers etched with an α-Si film as a mask by fluorine-base plasma, in which the patterns of recess in the dielectric layer are undamaged and the etching of the three dielectric layers is completed.

REFERENCE SIGNS in FIG. 1
1—Zep 520 positive EB photoresist;
2—dielectric layer;
3—silicon substrate.
In FIG. 2
1—α-Si film;
2—dielectric layer;
3—silicon substrate.

What is claimed is:

1. A method of patterning a dielectric layer, comprising the steps of:
   1) depositing an α-Si film on the dielectric layer to be etched;
   2) forming a photoresist mask with patterns on the α-Si film;
   3) etching the α-Si film by chlorine-based plasma with the photoresist mask, so as to transfer the patterns of the photoresist mask to the α-Si film;
   4) removing the photoresist mask;
   5) etching the dielectric layer by the fluorine-based plasma with the α-Si film as a hard mask, so as to transfer the patterns of the α-Si film to the dielectric layer;
   6) removing the α-Si film.

2. The method according to claim 1, wherein the depositing temperature in step 1) is about 520-550° C.

3. The method according to claim 1, wherein the step 2) comprises:
   a) spin-coating a layer of photoresist on the α-Si film;
   b) baking the layer of photoresist at a temperature of about 170-180° C. for about 20-40 minutes;
   c) exposing the layer of photoresist by electron beam direct writing;
   d) developing the layer of photoresist so as to form the photoresist mask with patterns;
   e) baking the photoresist mask at a temperature of about 130-140° C. for about 30-50 minutes.

4. The method according to claim 1, wherein in step 1), the thickness of the α-Si is selected in the range of 70-200 nm depending on the thickness and the type of the dielectric layer to be etched.

5. The method according to claim 1, wherein in step 2), the thickness of the photoresist mask is selected in the range of 200-600 nm depending on the thickness of the α-Si film.

6. The method according to claim 1, wherein in step 3), the chlorine-based plasma is generated from a mixed gas source of $Cl_2$ and He, or $Cl_2$ and Ar, or $Cl_2$ and $O_2$.

7. The method according to claim 1, wherein in step 4), the photoresist mask is removed by dry etching using $O_2$ plasma, or by wet etching using an etching solution of $H_2SO_4:H_2O_2=3:1-5:3$.

8. The method according to claim 1, wherein in step 5), the fluorine-based plasma is generated from $CF_4$, $CHF_3$, $C_3F_8$, $C_4F_8$, $NF_3$, or a mixture thereof.

9. The method according to claim 1, wherein in step 6), the α-Si film is removed by dry etching using chlorine-based plasma, or by wet etching using an aqueous solution of $NH_4OH$.

* * * * *